United States Patent
Sakamoto

(10) Patent No.: US 10,396,087 B2
(45) Date of Patent: Aug. 27, 2019

(54) SEMICONDUCTOR DEVICE AND METHOD FOR MANUFACTURING SAME

(71) Applicant: Toshiba Memory Corporation, Minato-ku (JP)

(72) Inventor: Wataru Sakamoto, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/700,375

(22) Filed: Sep. 11, 2017

(65) Prior Publication Data

US 2018/0083021 A1 Mar. 22, 2018

(30) Foreign Application Priority Data

Sep. 21, 2016 (JP) .................................. 2016-184373

(51) Int. Cl.
| | | |
|---|---|---|
| *H01L 27/11556* | (2017.01) | |
| *H01L 23/522* | (2006.01) | |
| *H01L 23/528* | (2006.01) | |
| *H01L 27/11582* | (2017.01) | |

(52) U.S. Cl.
CPC .... *H01L 27/11556* (2013.01); *H01L 23/5226* (2013.01); *H01L 23/5283* (2013.01); *H01L 27/11582* (2013.01)

(58) Field of Classification Search
CPC ......... H01L 27/11556; H01L 27/11582; H01L 23/5226; H01L 23/5283
See application file for complete search history.

(56) References Cited

U.S. PATENT DOCUMENTS

| | | | |
|---|---|---|---|
| 2010/0109072 A1* | 5/2010 | Kidoh | ................. H01L 27/0688 257/324 |
| 2010/0202206 A1 | 8/2010 | Seol et al. | |
| 2011/0310670 A1 | 12/2011 | Shim et al. | |
| 2012/0003800 A1* | 1/2012 | Lee | ................... H01L 27/11551 438/261 |
| 2012/0098051 A1* | 4/2012 | Son | ................... H01L 27/11582 257/324 |
| 2015/0060992 A1 | 3/2015 | Taekyung et al. | |
| 2015/0109862 A1 | 4/2015 | Shibata et al. | |

FOREIGN PATENT DOCUMENTS

| | | |
|---|---|---|
| JP | 2010-187000 | 8/2010 |
| JP | 2015-050466 | 3/2015 |
| JP | 2015-079862 | 4/2015 |

* cited by examiner

*Primary Examiner* — Su C Kim
(74) *Attorney, Agent, or Firm* — Oblon, McClelland, Maier & Neustadt, L.L.P.

(57) ABSTRACT

A semiconductor device includes a stacked body 100, first insulating layers 45, a second insulating layer 46 and columnar portions CL. The stacked body 100 includes electrode layers 41 stacked with an insulating body interposed along a Z-direction. The first insulating layers 45 extend in an X-direction and are provided in the stacked body 100 from an upper end thereof to a lower end thereof. The second insulating layer extends in the X-direction and is provided in the stacked body 100 from the upper end to partway through the stacked body 100 between one of the first insulating layers 45 and another one of the first insulating layers 45. The columnar portion CL has a bowed configuration. The second insulating layer 46 is provided in a region B including a location of a maximum inner diameter Dm of the columnar portion CL.

10 Claims, 15 Drawing Sheets

US 10,396,087 B2

SEMICONDUCTOR DEVICE AND METHOD FOR MANUFACTURING SAME

CROSS-REFERENCE TO RELATED APPLICATIONS

This application is based upon and claims the benefit of priority from Japanese Patent Application No. 2016-184373, filed on Sep. 21, 2016; the entire contents of which are incorporated herein by reference.

FIELD

Embodiments relate to a semiconductor device and a method for manufacturing the same.

BACKGROUND

A memory device that has a three-dimensional structure has been proposed in which a memory hole is formed in a stacked body in which multiple electrode layers are stacked, and a charge storage film and a semiconductor film are provided to extend in the stacking direction of the stacked body inside the memory hole. Slits that reach the substrate from the upper surface of the stacked body are multiply formed in the stacked body. When the number of stacks of the stacked body is increased for higher integration, the aspect ratio of the memory hole becomes high. "Bowing" becomes pronounced for the memory hole having the high aspect ratio. For example, the electrode layers of the memory device are formed by replacing sacrificial layers with conductive bodies via a slit. The resistance increases easily for the electrode layers at the location where the inner diameter of the memory hole is large due to the "bowing." It is desirable to suppress the increase of the resistance of the electrode layers.

DETAILED DESCRIPTION

Figure 1:
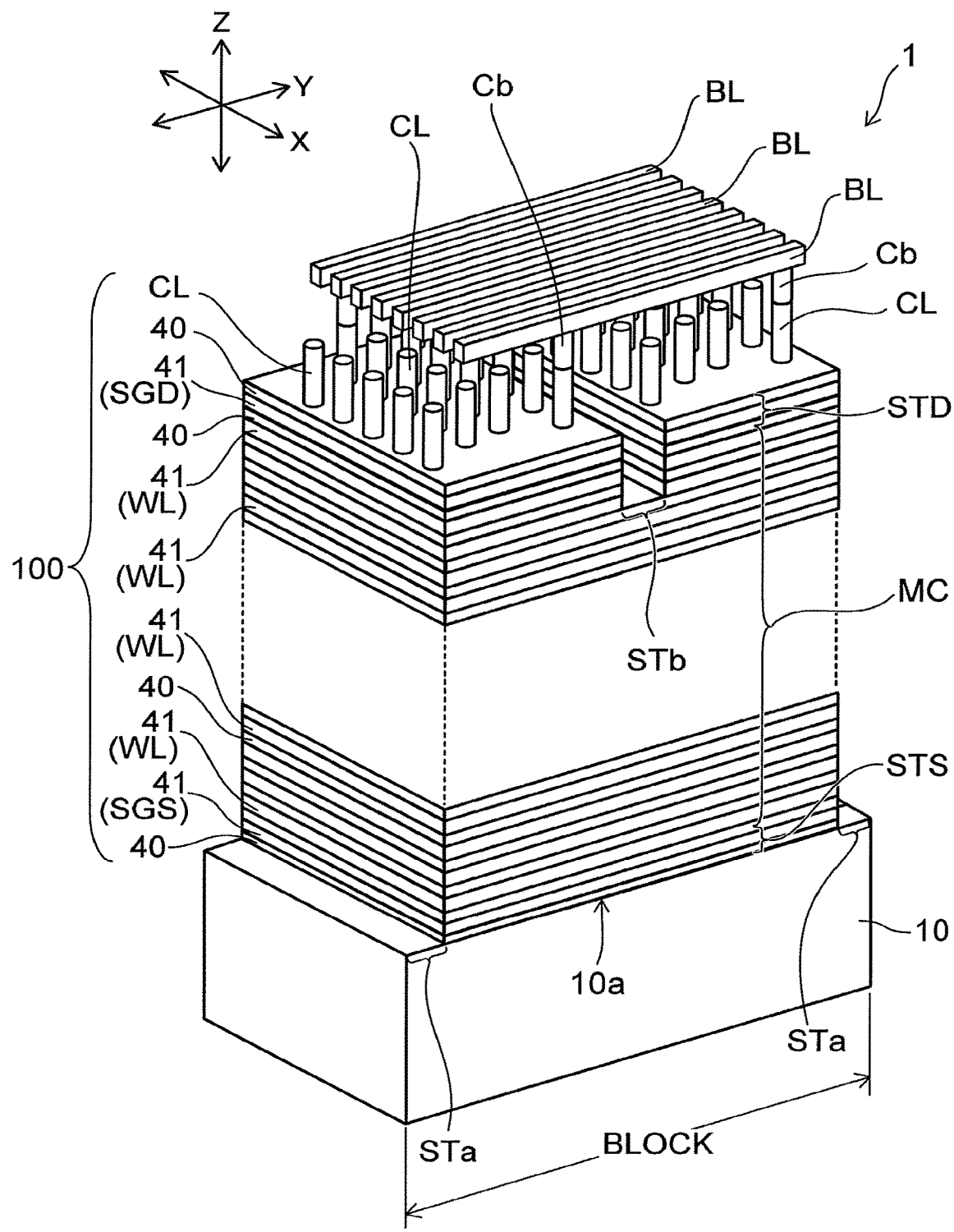
FIG. 1 is a schematic perspective view of a semiconductor device of a first embodiment.

A semiconductor device according to an embodiment, includes a stacked body, at least two first insulating layers, at least one second insulating layer and a plurality of columnar portions. The stacked body includes a plurality of electrode layers stacked with an insulating body interposed along a stacking direction. The first insulating layers extend in a first direction crossing the stacking direction and are provided in the stacked body from an upper end of the stacked body to a lower end of the stacked body. The second insulating layer extends in the first direction and is provided in the stacked body from the upper end of the stacked body to partway through the stacked body between one of the first insulating layers and another one of the first insulating layers. The plurality of columnar portions include a semiconductor body and a charge storage portion. The semiconductor body extends in the stacking direction. The charge storage portion is provided between the semiconductor body and the electrode layers. The plurality of columnar portions are provided in the stacked body between the second insulating layer and the one of the first insulating layers and between the second insulating layer and the other one of the first insulating layers. The columnar portion has a bowed configuration. The second insulating layer is provided in a region including a location of a maximum inner diameter of the columnar portion.

Hereinafter, embodiments will be described with reference to the drawings. In the drawings, the same reference numerals are attached to the same elements. In the embodiment, "above" refers to, for example, a direction away from a substrate, and "below" refers to a direction towards the substrate. The semiconductor device of the embodiment is a semiconductor memory device having a memory cell array.

First Embodiment

<Semiconductor Device>

FIG. 1 is a schematic perspective view of a semiconductor device of a first embodiment. In FIG. 1, two mutually-orthogonal directions parallel to a major surface of a substrate 10 are taken as an X-direction (a first direction) and a Y-direction (a second direction); and a direction crossing, e.g., orthogonal to, both the X-direction and the Y-direction is taken as a Z-direction (the stacking direction of a stacked body 100).

As shown in FIG. 1, the semiconductor device of the first embodiment includes a memory cell array 1. The memory cell array 1 is provided in the stacked body 100. The stacked body 100 is provided on a major surface 10a of the substrate 10. The substrate 10 includes, for example, a silicon layer that is crystallized. The conductivity type of the silicon layer is, for example, a p-type.

The stacked body 100 includes multiple insulating bodies 40 and multiple electrode layers 41 stacked alternately. The electrode layers 41 include a conductor. The conductor is, for example, conductive silicon (Si), tungsten (W), molybdenum (Mo), etc. The insulating bodies 40 include an insulator. The insulator is, for example, silicon oxide, etc. The insulator may be an air gap. The electrode layers 41 are provided to be electrically insulated by the insulating bodies 40 in the Z-direction inside the stacked body 100.

The electrode layers 41 include at least one source-side selection gate (SGS), multiple word lines (WL), and at least one drain-side selection gate (SGD). The SGS is a gate electrode of a source-side selection transistor (STS). The WL is a gate electrode of a memory cell (MC). The SGD is a gate electrode of a drain-side selection transistor (STD). The number of stacks of the electrode layers 41 is arbitrary.

The SGS is provided in the lower region of the stacked body 100. The SGD is provided in the upper region of the stacked body 100. The lower region refers to the region of the stacked body 100 on the side proximal to the substrate 10; and the upper region refers to the region of the stacked body 100 on the side distal to the substrate 10. For example, at least one of the multiple electrode layers 41 including the electrode layer 41 most proximal to the substrate 10 is used as the SGS. At least one of the multiple electrode layers 41 including the electrode layer 41 most distal to the substrate 10 is used as the SGD. The WLs are provided between the SGS and the SGD.

The semiconductor device of the first embodiment includes the multiple MCs connected in series between the STD and the STS. The structure in which the STD, the MCs, and the STS are connected in series is called a "memory string (or a NAND string)." For example, the memory string is connected to a bit line (BL) via a contact Cb. The BL is provided above the stacked body 100 and extends in the Y-direction.

Figure 2:
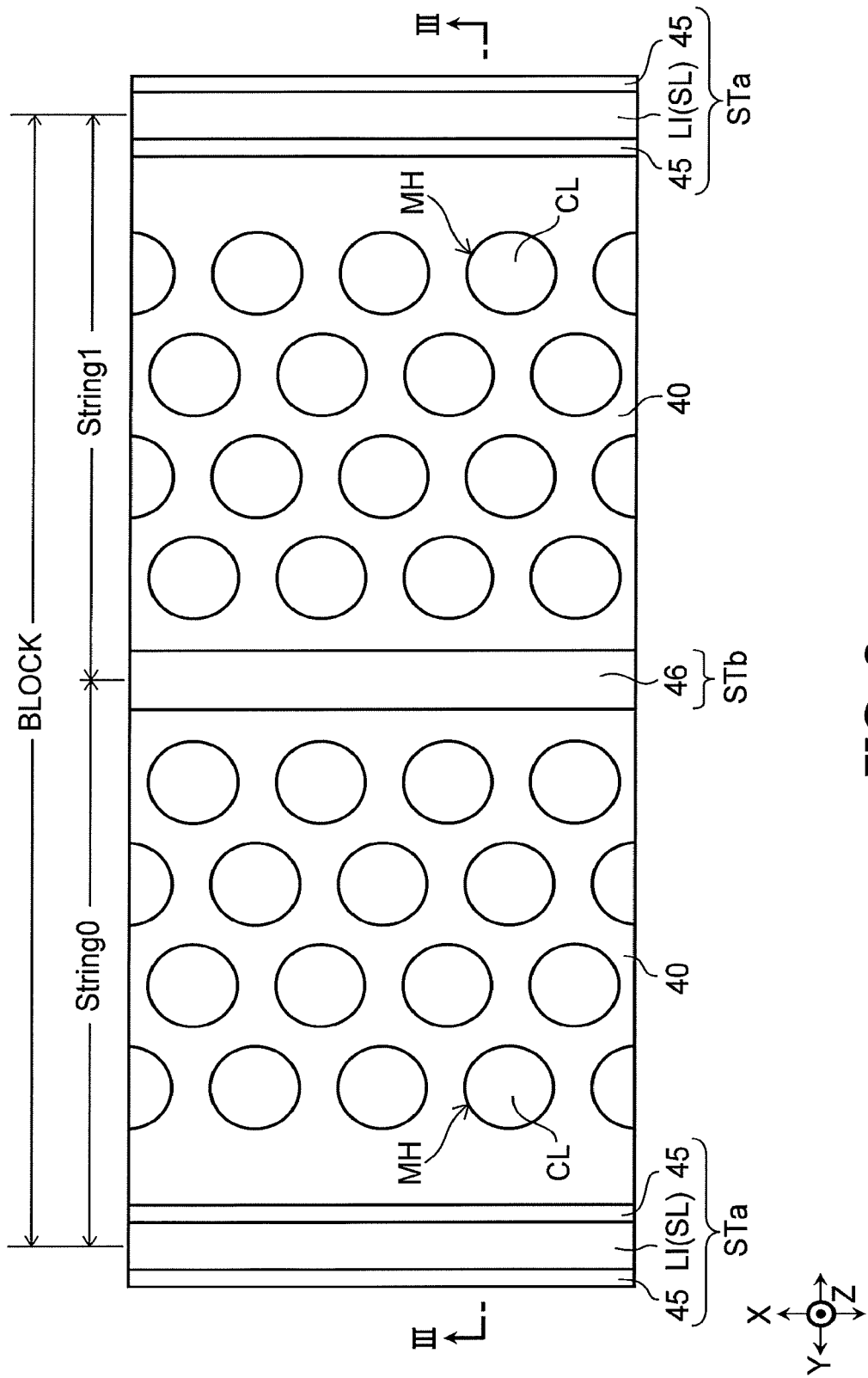
FIG. 2 is a schematic plan view of the semiconductor device of the first embodiment.
Figure 3:
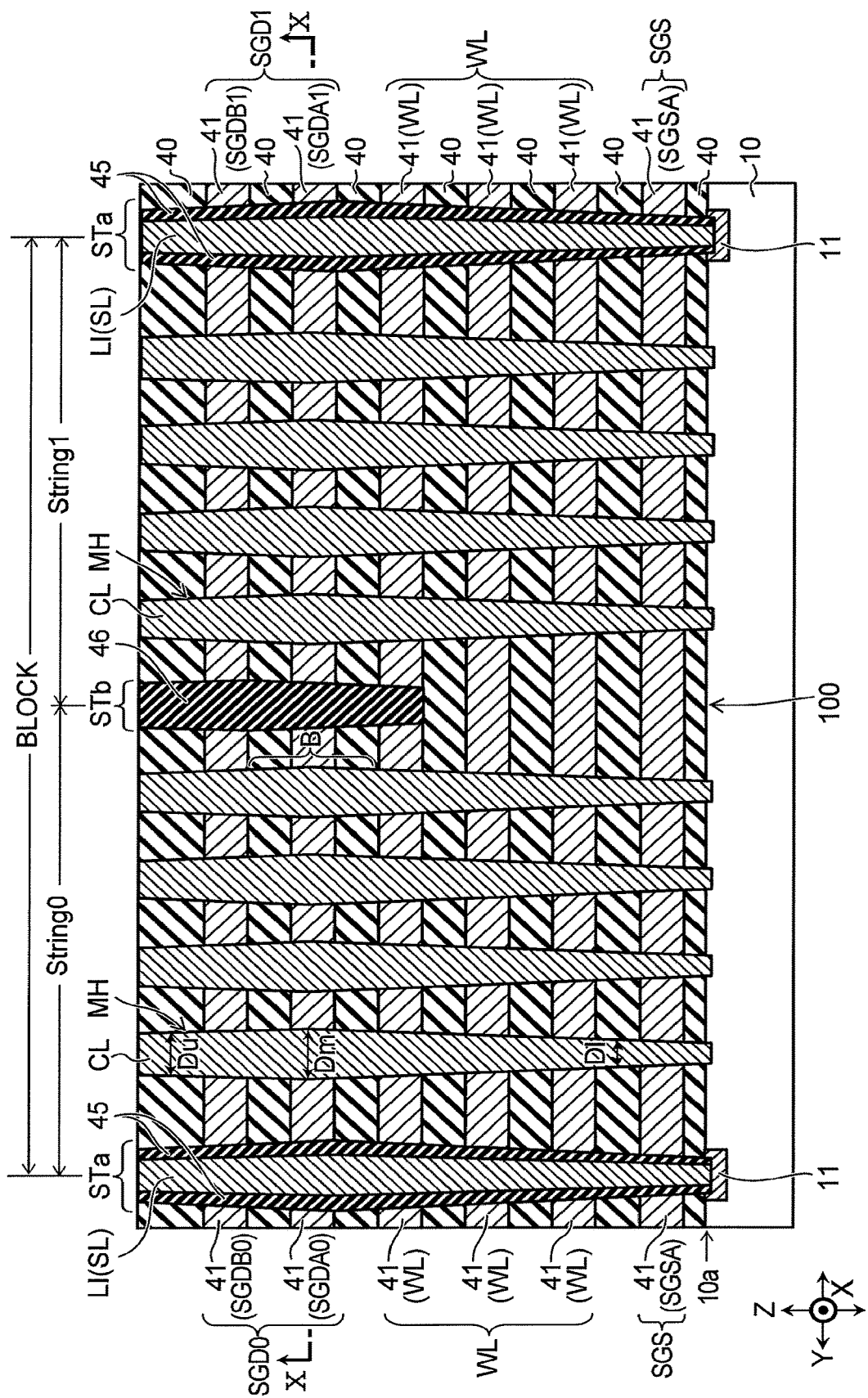
FIG. 3 is a schematic cross-sectional view along line III-III in FIG. 2.

FIG. 2 is a schematic plan view of the semiconductor device of the first embodiment. FIG. 3 is a schematic cross-sectional view along line III-III in FIG. 2.

Deep first slits STa, a shallow second slit STb, and columnar portions CL are provided inside the stacked body 100.

The first slits STa are provided from the upper end of the stacked body 100 to the lower end of the stacked body 100. Two first slits STa are shown in the area shown in FIG. 2 and FIG. 3. The two first slits extend in the X-direction. First insulating layers 45 are provided on the side walls of the first slits STa. The first insulating layers 45 include an insulator. The insulator is, for example, silicon oxide. The stacked body 100 is divided along the X-direction by the first insulating layers 45. The region of the stacked body 100 interposed between the two first slits is called a block (BLOCK). The BLOCK is, for example, the minimum unit of the information erase. The erase size is set to one BLOCK or is set by combining multiple BLOCKs.

A conductive layer LI is provided along the first insulating layer 45 inside the first slit STa. The conductive layer LI reaches the substrate 10. An n-type semiconductor layer 11 is provided in the substrate 10. The conductive layer LI is electrically connected to the semiconductor layer 11. The conductive layer LI includes a conductor. The conductor is, for example, W. For example, the conductive layer LI functions as a source line (SL).

The second slit STb is provided inside the BLOCK of the stacked body 100. The second slit STb extends in the X-direction. The second slit STb is different from the first slit STa and is provided from the upper end of the stacked body 100 to partway through the stacked body 100. A second insulating layer 46 is provided inside the second slit STb. The second insulating layer 46 includes an insulator. The insulator is, for example, silicon oxide. In the embodiment, the second insulating layer 46 extends in the X-direction and, for example, divides the SGD into two along the X-direction. In the embodiment, one of the two divided SGDs is called the "SGD0;" and the remaining one is called the "SGD1." The memory string that includes the SGD0 belongs to the "String0." The memory string that includes the SGD1 belongs to the "String1." The "String0" and the "String1" are connected in parallel between the SL and the BL.

In the semiconductor device shown in FIG. 3, the SGD0 includes the two SGDA0 and SGDB0. The SGD1 includes the two SGDA1 and SGDB1. The SGS includes one of the SGSAs. Other than the WLs that are actually used, the WLs may include a drain-side dummy word line (WLDD) and a source-side dummy word line (WLDS).

The columnar portions CL are provided in the stacked body 100 between the second insulating layer 46 and one of the first insulating layers 45 and between the second insulating layer 46 and another one of the first insulating layers 45. The columnar portions CL extend in the Z-direction and are provided from the upper end of the stacked body 100 to the lower end of the stacked body 100. The columnar portions CL are provided inside memory holes MH. The memory holes MH are provided inside the stacked body 100. The memory holes MH are holes extending in the Z-direction. The lower ends of the memory holes MH reach the substrate 10. The memory holes MH are formed in circular columnar configurations or elliptical columnar configurations.

Figure 4:
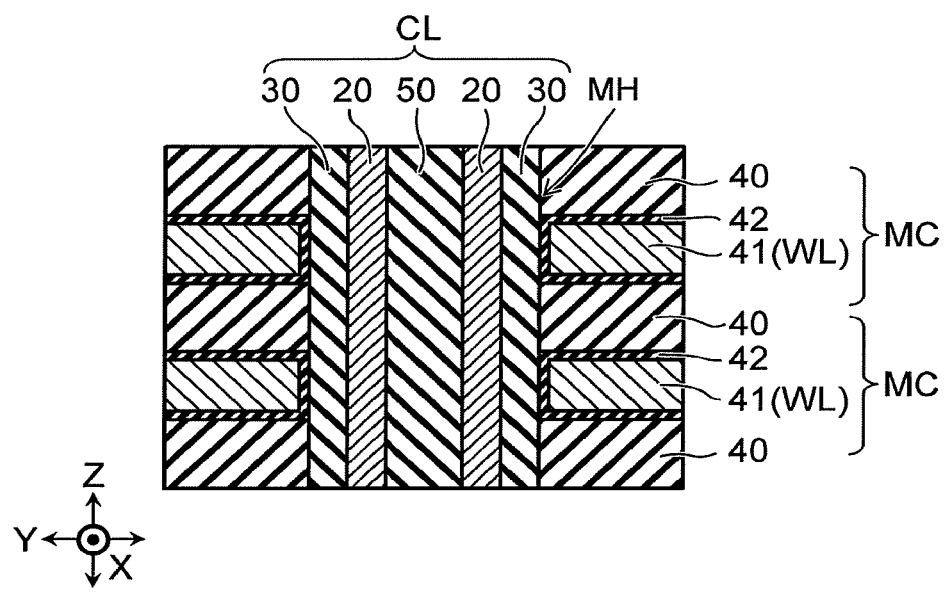
FIG. 4 is a schematic cross-sectional view showing an enlargement of one example of a columnar portions.

FIG. 4 is a schematic cross-sectional view showing an enlargement of one example of the columnar portions CL. For example, the cross section shown in FIG. 4 corresponds to the cross section shown in FIG. 3; and only the portion where the MCs are provided is shown. The "bowing" of the memory hole MH is not reflected in FIG. 4.

As shown in FIG. 4, the columnar portion CL includes a memory film 30, a semiconductor body 20, and a core layer 50. The memory film 30, the semiconductor body 20, and the core layer 50 are provided inside the memory hole MH. The memory film 30 includes a charge storage portion inside a film. The charge storage portion includes, for example, a floating gate and/or trap sites that trap charge. The threshold voltage of the MC changes due to the existence or absence of the charge or the amount of the charge inside the charge storage portion. Thereby, the MC stores information. Although not illustrated in FIG. 5, the memory film 30 includes a tunneling insulating film between the charge storage portion and the semiconductor body 20.

Similarly, although not illustrated in FIG. 4, the memory film 30 includes a first blocking insulating film between the charge storage portion and the electrode layer 41. Tunneling of the charge, e.g., electrons and/or holes, occurs in the tunneling insulating film when erasing the information and when programming the information. The memory film 30 may be removed at the portions where the electrode layer 41 used as the SGD and the electrode layer 41 used as the SGS are formed. In such a case, a gate insulating film 31 of the STD or the STS is provided instead of the memory film 30.

The semiconductor body 20 extends in the Z-direction. The semiconductor body 20 includes, for example, P-type silicon that is crystallized. For example, the semiconductor body 20 is electrically connected to the substrate 10.

The core layer 50 includes an insulator. The insulator is, for example, silicon oxide. The core layer 50 fills the memory hole MH where the memory film 30 and the semiconductor body 20 are provided.

A second blocking insulating film 42 is provided between the electrode layer 41 and the insulating body 40 and between the electrode layer 41 and the memory film 30. The second blocking insulating film 42 includes, for example, silicon oxide and aluminum oxide. For example, the second blocking insulating film 42 suppresses back-tunneling of the charge in the erase operation from the WL into the charge storage portion included in the memory film 30.

Although not illustrated in FIG. 4, the memory hole MH of the embodiment has a "bowed configuration" as shown in FIG. 3. For example, the memory hole MH that has the bowed configuration has an inner diameter Du of the memory hole MH at the upper region of the stacked body 100, an inner diameter Dl of the memory hole MH at the lower region of the stacked body 100, and an inner diameter Dm of the memory hole MH at a middle region between the upper region and the lower region that are different from each other. For example, the inner diameter Dm is the maximum. The inner diameter of the memory hole MH is the inner diameter of the columnar portion CL.

The second slit STb is provided in a "bowing region B" including the location of the maximum inner diameter Dm of the memory holes MH. The "bowing region B" is the location where the "bowing" of the memory hole MH occurs most markedly. In the embodiment, the bottom of the second slit STb passes through the "bowing region B." The bottom of the second slit STb is the bottom of the second insulating layer 46. Thereby, the second insulating layer 46 of the embodiment is provided in the stacked body 100 from the upper end of the stacked body 100 to the "bowing region B" including the location of the maximum inner diameter of the columnar portion CL.

<Manufacturing Method>

FIG. 5 to FIG. 9 are schematic cross-sectional views showing a method for manufacturing the semiconductor device of the first embodiment. The cross sections shown in FIG. 5 to FIG. 9 correspond to the cross section shown in FIG. 3.

1. Formation of Stacked Body 100

Figure 5:
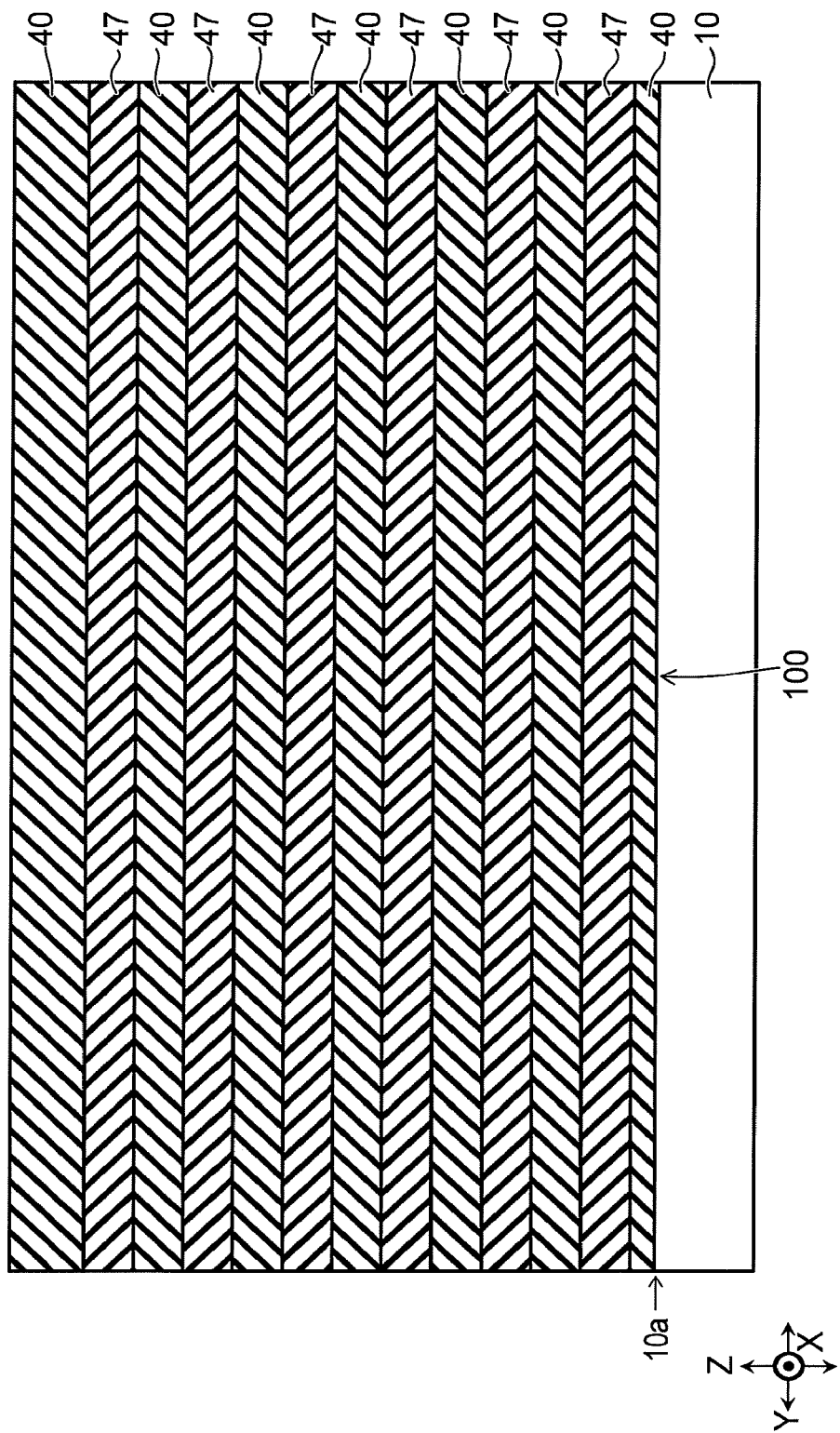
FIG. 5 to FIG. 9 are schematic cross-sectional views showing a method for manufacturing the semiconductor device of the first embodiment.

As shown in FIG. 5, the stacked body 100 is formed on the major surface 10a of the substrate 10. The stacked body 100 is formed by alternately stacking the insulating bodies 40 and sacrificial layers 47 in the Z-direction. Materials that can have mutual selectivity of etching are selected as the insulating bodies 40 and the sacrificial layers 47. In the case where, for example, silicon oxide is selected as the insulating bodies 40, for example, silicon nitride is selected as the sacrificial layers 47.

2. Formation of Memory Holes MH and Columnar Portions CL

Figure 6:
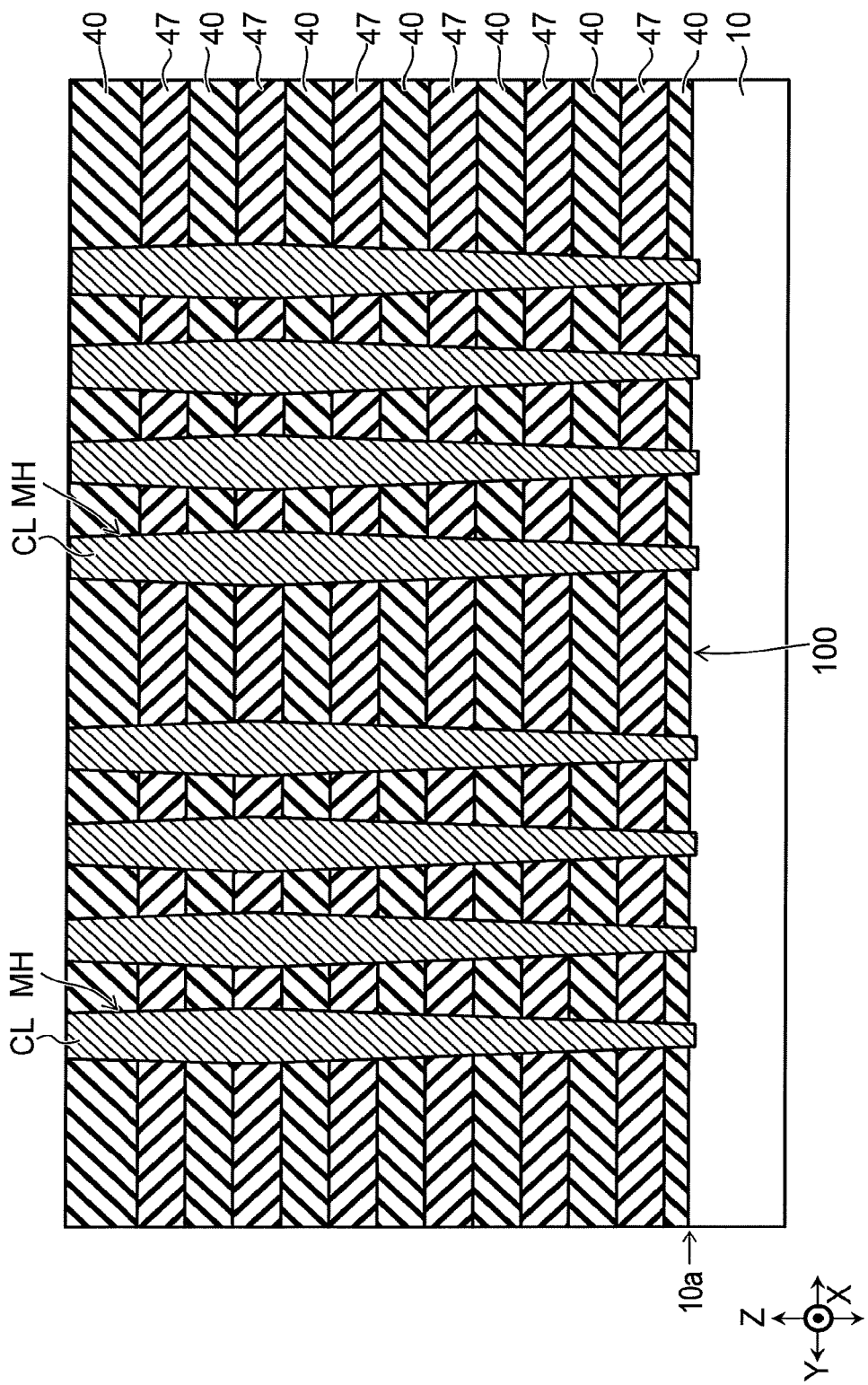

As shown in FIG. 6, the memory holes MH are formed in the stacked body 100. For example, the memory holes MH are formed in the stacked body 100 by anisotropic etching using a photoresist as a mask. The memory holes MH are formed to pierce the stacked body 100 and reach the substrate 10. In the embodiment, the cross-sectional configurations of the memory holes MH are bowed configurations.

Then, the columnar portions CL are formed in the memory holes MH. Although the details of the columnar portions CL are not illustrated in FIG. 6, for example, the memory film 30 shown in FIG. 4 is formed on the stacked body 100. Then, the portion of the memory film 30 that is on the bottoms of the memory holes MH is removed; and the substrate 10 is exposed from the bottoms of the memory holes MH. Then, the semiconductor body 20 is formed on the memory film 30. Then, the core layer 50 is formed on the semiconductor body 20. The core layer 50 fills the memory holes MH where the memory film 30 and the semiconductor body 20 are formed. Thereby, the columnar portions CL are formed in the memory holes MH.

3. Formation of First Slits STa and Second Slit STb

Figure 7:
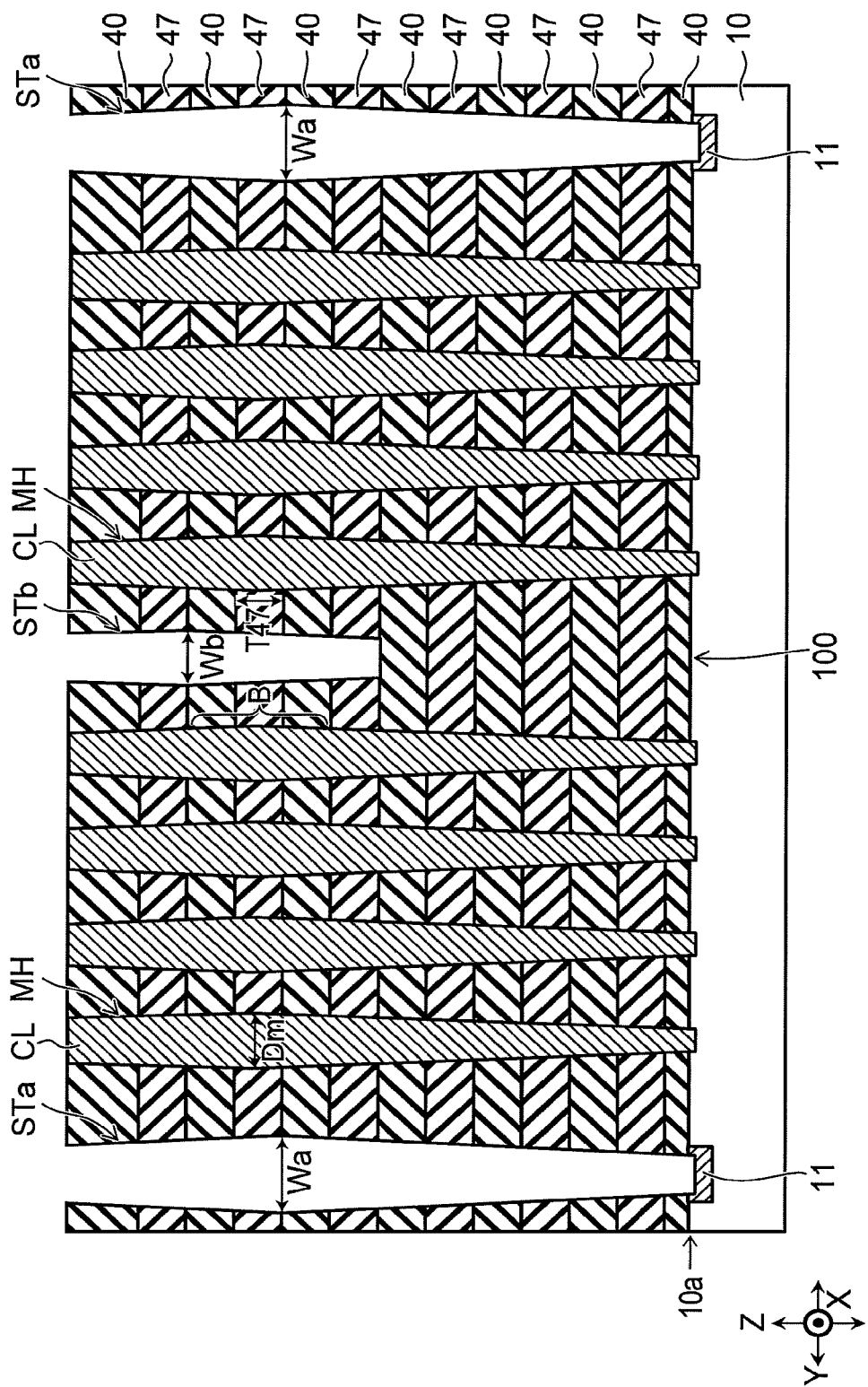

As shown in FIG. 7, the first slits STa and the second slit STb are formed in the stacked body 100. For example, the first slits STa and the second slit STb are formed in the stacked body 100 by anisotropic etching using a photoresist as a mask.

The first slits STa are formed from the upper end of the stacked body 100 to the lower end of the stacked body 100. After forming the first slits STa, for example, an n-type impurity is introduced to the substrate 10 via the first slits STa. Thereby, the n-type semiconductor layers 11 are formed in the substrate 10.

The second slit STb is formed from the upper end of the stacked body 100 to partway through the stacked body 100. The second slit STb of the embodiment is provided in the "bowing region B" including the location of the maximum inner diameter Dm of the memory holes MH. In the embodiment, the bottom of the second slit STb passes through the "bowing region B" and reaches a position lower than the "bowing region B" (a position proximal to the substrate 10).

For example, the first slits STa and the second slit STb are formed separately in the stacked body 100. If possible, the first slits STa and the second slit STb may be formed simultaneously. It can be arbitrarily selected whether to form the first slits STa first or to form the second slit STb first. The first slits STa and the second slit STb may be formed simultaneously in the stacked body 100.

In the embodiment, a width Wb in the Y-direction of the second slit STb is narrower than a width Wa in the Y-direction of the first slit STa. This is because, for example, the conductive layers LI are formed inside the first slits STa as shown in FIG. 3, etc.; but, for example, it is not always necessary to form the conductive layer LI inside the second slit STb. In FIG. 7, the width Wb shows the width at the location of the second slit STb where the bowing is most pronounced. Similarly, the width Wa shows the width at the location of the first slits STa where the bowing is most pronounced.

For example, the minimum value of the width Wb in the Y-direction of the second slit STb is set to be wider than a thickness T47 in the Z-direction of the sacrificial layer 47. For example, this is to make it possible to replace the sacrificial layers 47 via the second slit STb. For example, in the case where the width Wb is narrower than the thickness T47, the second slit STb is undesirably plugged with the conductor used to form the electrode layers 41 before the spaces where the sacrificial layers 47 are removed are filled with the conductor used to form the electrode layers 41. If the second slit STb is undesirably plugged, the replacement via the second slit STb cannot be performed. For example, due to such a reason, the minimum value of the width Wb is set to be, for example, wider than the thickness T47.

4. Removing of Sacrificial Layers 47 (Replace Process)

Figure 8:
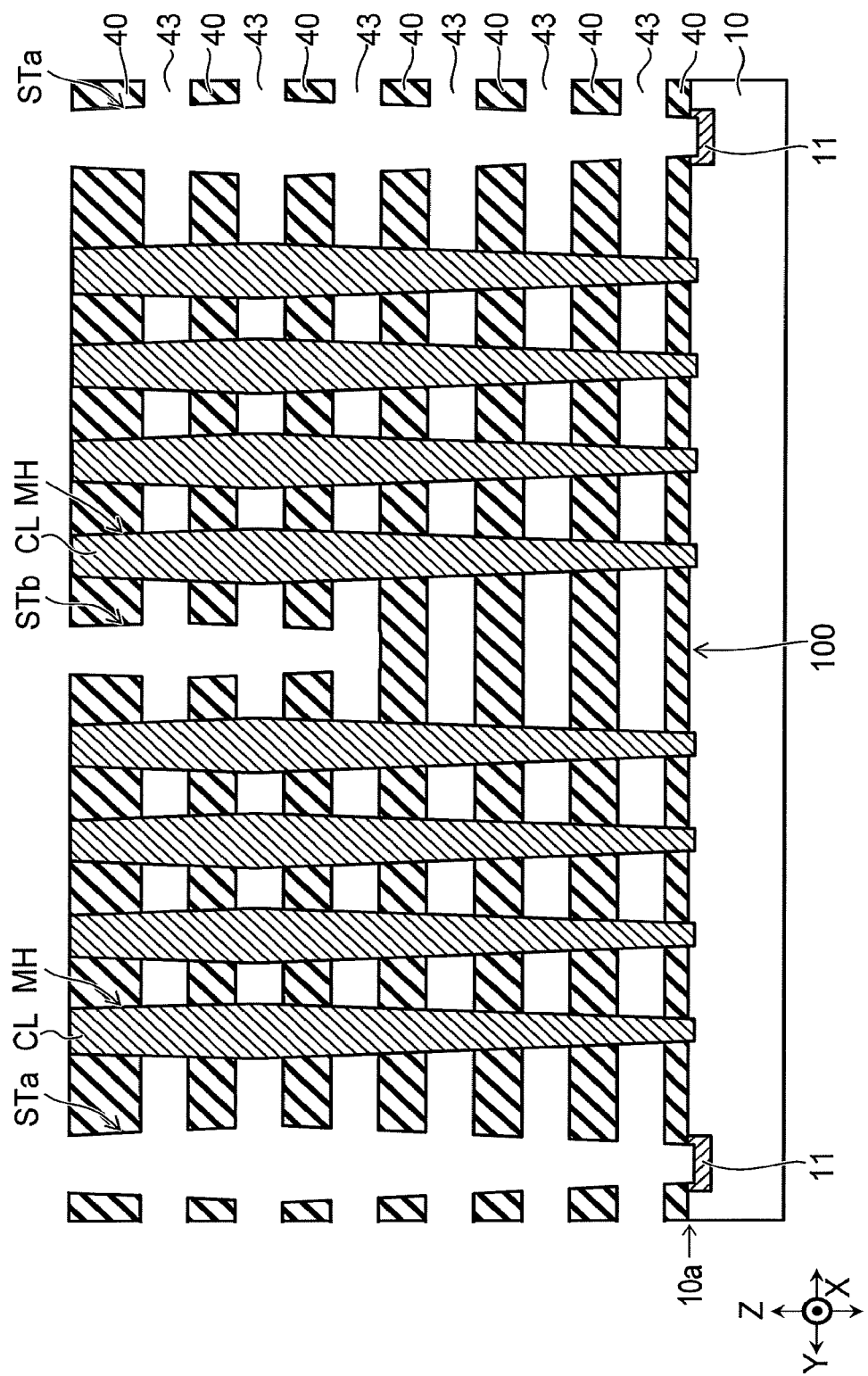

As shown in FIG. 8, the sacrificial layers 47 are removed via the first slits STa and the second slit STb. Thereby, spaces 43 are formed between the insulating bodies 40.

5. Filling of Electrode Layers 41 (Replace Process)

Figure 9:
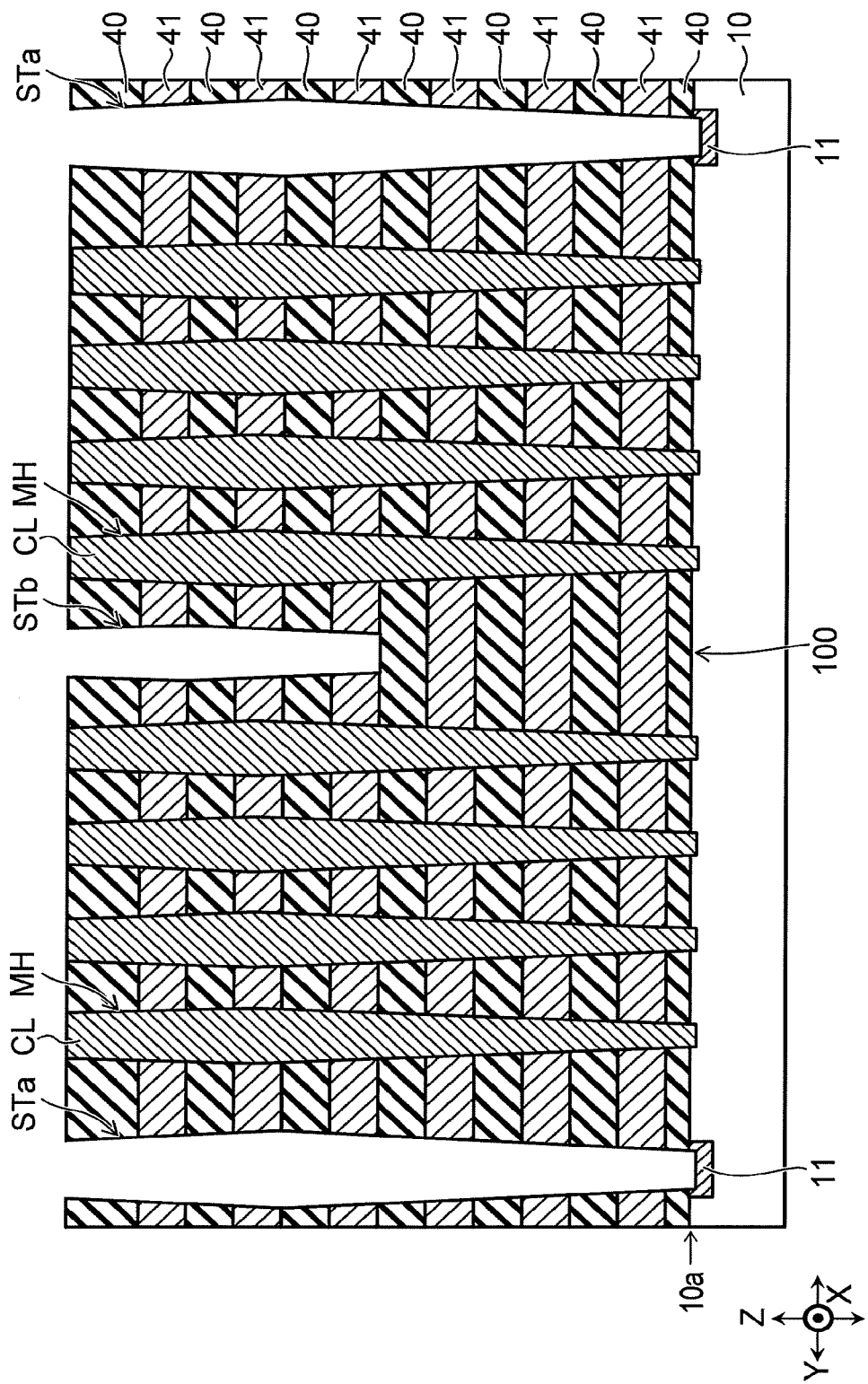

As shown in FIG. 9, the spaces 43 are filled with the electrode layers 41. Thereby, the electrode layers 41 are formed in the stacked body 100. The electrode layers 41 are formed also on the side walls of the first slits STa and the side wall of the second slit STb. The electrode layers 41 that are formed on the side walls of the first slits STa and the electrode layers 41 that are formed on the side wall of the second slit STb are removed. FIG. 9 shows the state in which the electrode layers 41 are removed from the side walls of the first slits STa and the side wall of the second slit STb.

6. Formation of First Insulating Layers 45, Second Insulating Layer 46, and Conductive Layers LI As shown in FIG. 3, the first insulating layers 45 are formed on the side walls of the first slits STa. Then, the second slit STb is filled with the second insulating layer 46. It can be arbitrarily selected whether to form the first insulating layers 45 first or to form the second insulating layer 46 first. If possible, the first insulating layers 45 and the second insulating layer 46 may be formed simultaneously.

Then, the first insulating layers 45 are removed from the bottoms of first slits ST. Thereby, the semiconductor layers 11 are exposed at the bottoms of the first slits ST. Then, the conductive layers LI are formed in the first slits ST. The conductive layers LI are electrically connected to the semiconductor layers 11. Thereafter, it is sufficient to use well-known manufacturing methods.

For example, the semiconductor device of the first embodiment can be manufactured by the manufacturing method shown in FIG. 5 to FIG. 9.

According to such a first embodiment, advantages such as those recited below can be obtained.

Figure 10:
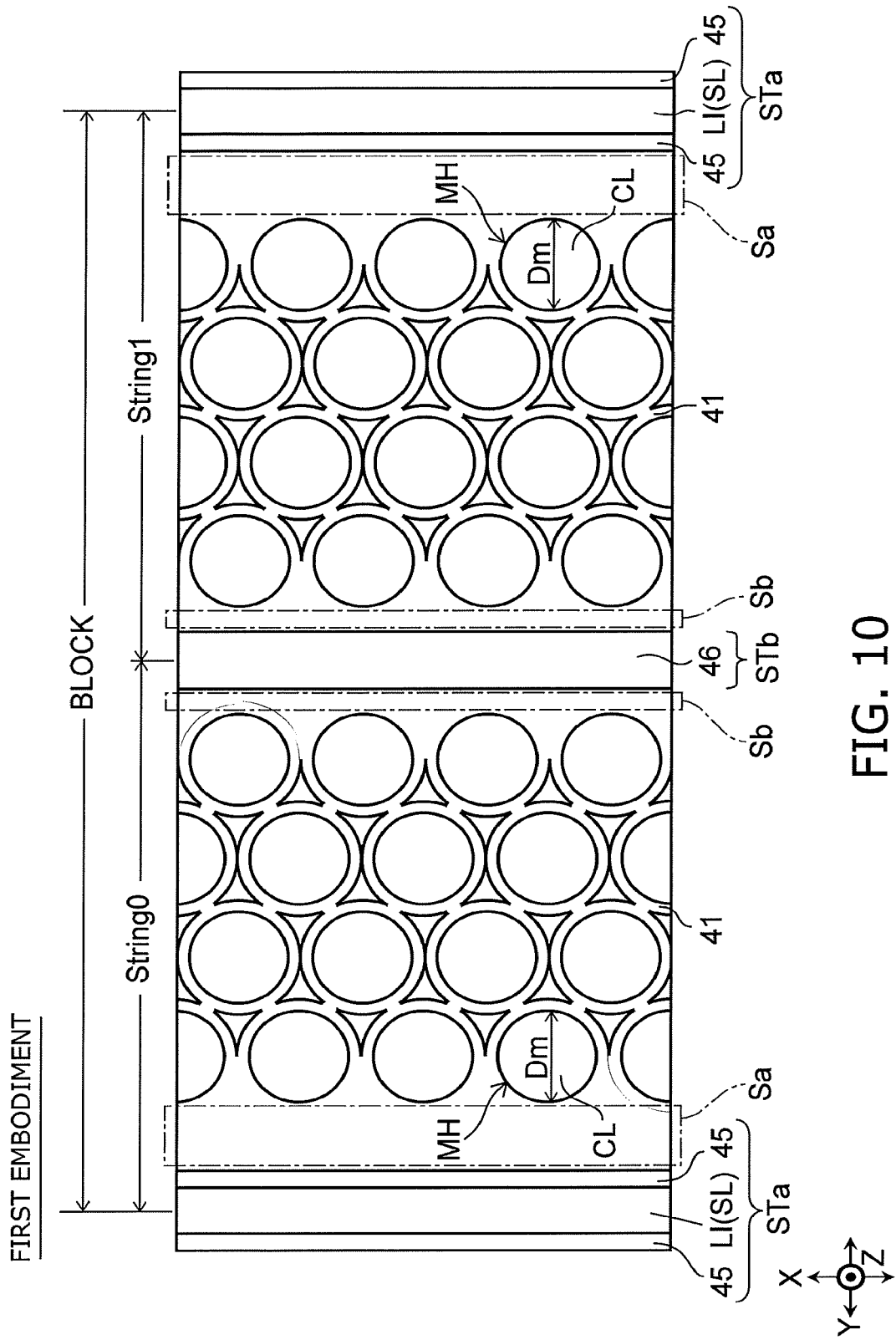
FIG. 10 is a schematic cross-sectional view along line X-X in FIG. 3.

FIG. 10 is a schematic cross-sectional view along line X-X in FIG. 3. The cross section shown in FIG. 10 is, for example, a cross section along the XY plane. The cross section shown in FIG. 10 shows the location where the "bowing" is pronounced. The inner diameters of the memory holes MH shown in FIG. 10 are assumed to be the maximum inner diameter Dm shown in FIG. 3.

According to the first embodiment, the replacement of the sacrificial layers 47 with the electrode layers 41 is performed via both the first slit STa and the second slit STb. The second slit STb is provided in the "bowing region B" including the location of the maximum inner diameter Dm. Therefore, in the "bowing region B" where the "bowing" of the memory holes MH is most pronounced, the conductor used to form the electrode layers 41 enters from the second slit STb toward the interior of the stacked body 100. Therefore, the spaces between the second slit STb and the columnar portions CL can be filled with the conductor in the "bowing region B."

As shown in FIG. 10, a region Sa exists where the resistance of the electrode layer 41 is low. The region Sa is between the first slit STa and the columnar portions CL. One reason that the resistance is low in the region Sa is because there are no columnar portions CL in the region Sa; and the region Sa is filled with the conductor used to form the electrode layer 41.

In the first embodiment, a region Sb that is similar to the region Sa exists in the electrode layer 41 contacting the second slit STb. The region Sb is between the second slit STb and the columnar portions CL. Similarly to the region Sa, there are no columnar portions CL in the region Sb; and the region Sb also is filled with the conductor used to form the electrode layer 41. Accordingly, similarly to the region Sa, the resistance is low in the region Sb.

Figure 11:
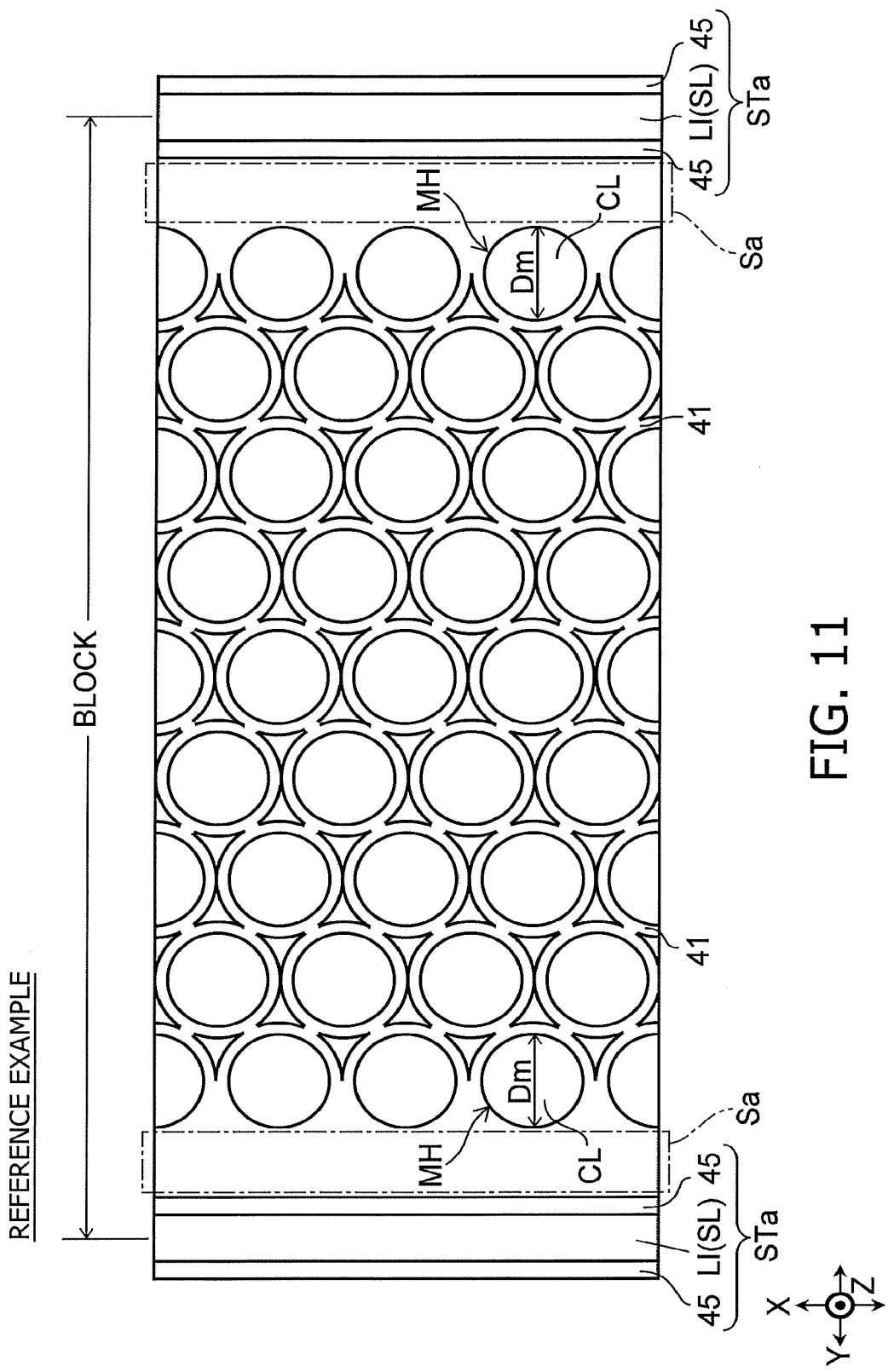
FIG. 11 is a schematic cross-sectional view of a reference example.

FIG. 11 is a schematic cross-sectional view of a reference example. The cross section shown in FIG. 11 corresponds to the cross section shown in FIG. 10. The reference example shown in FIG. 11 is one example in which there is no second slit STb.

As shown in FIG. 11, in the case where there is no second slit STb, the electrode layer 41 between the first slits STa undesirably has a mesh configuration as-is. In particular, in the "bowing region B," the inner diameters Dm of the memory holes MH are large. Therefore, the distances between adjacent memory holes MH are short. Accordingly, the width of the electrode layer 41 formed at the periphery of the memory holes MH also is fine; and the resistance of the electrode layer 41 increases easily.

Compared to such a reference example, according to the first embodiment, the region Sb is formed between the first slits STa because the second slit STb exists. Moreover, in the first embodiment, the region Sb is provided in the "bowing region B." Therefore, the increase of the resistance of the electrode layer 41 is suppressed at the location where the resistance of the electrode layer 41 increases most easily.

Thus, according to the first embodiment, for example, compared to the reference example shown in FIG. 10, a semiconductor device and a method for manufacturing the semiconductor device can be obtained in which it is possible to suppress the increase of the resistance of the electrode layer 41 in the "bowing region B" where the "bowing" of the memory holes MH is the most pronounced.

Second Embodiment

<Semiconductor Device>

Figure 12:
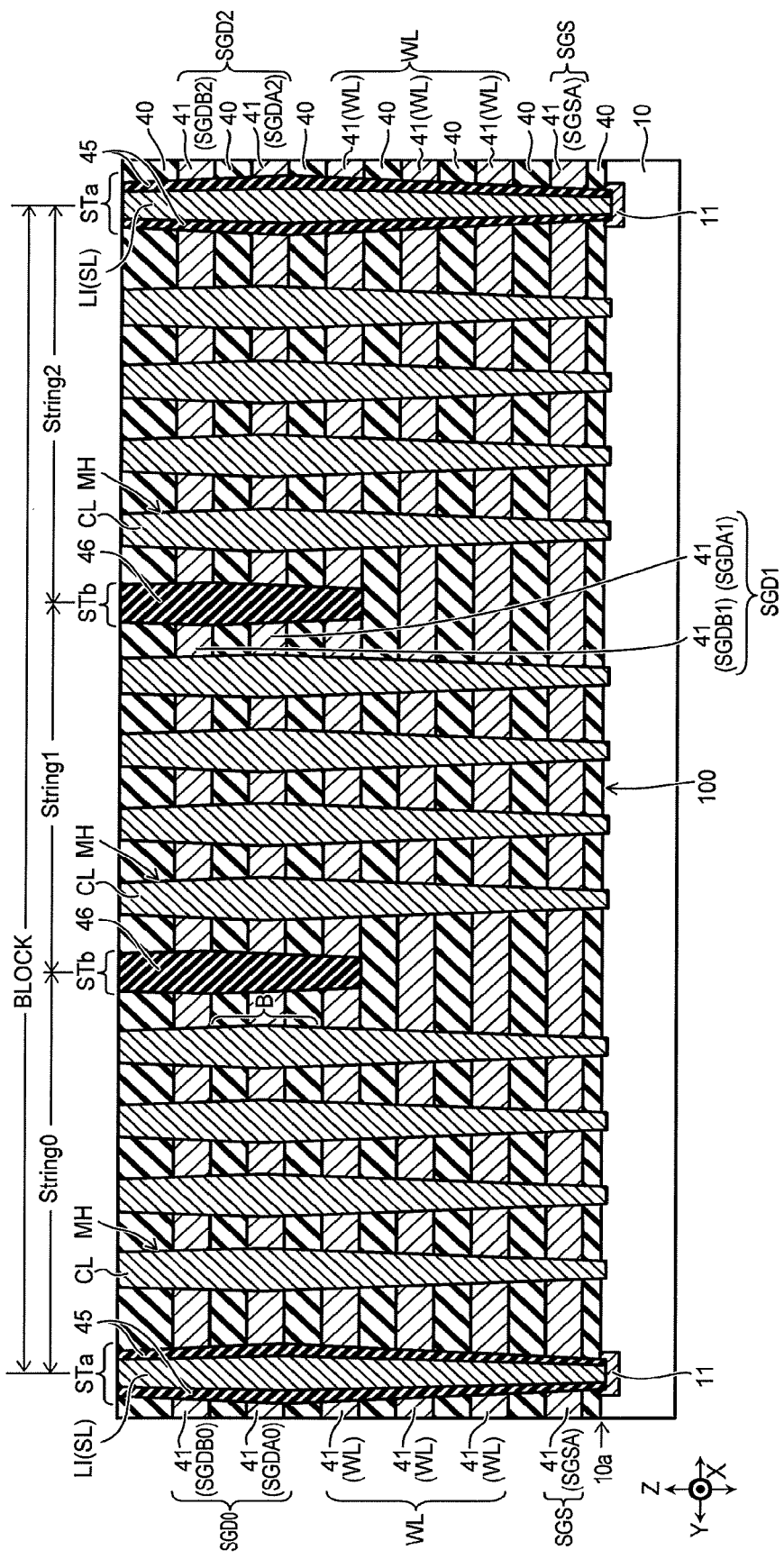
FIG. 12 is a schematic cross-sectional view of a semiconductor device of a second embodiment.

FIG. 12 is a schematic cross-sectional view of a semiconductor device of a second embodiment. The cross section shown in FIG. 12 corresponds to the cross section shown in FIG. 3.

As shown in FIG. 12, for example, the second embodiment differs from the first embodiment shown in FIG. 3 in that two second slits STb are provided in one BLOCK. In the second embodiment, the three Strings of the String0 to the String2 are set in the one BLOCK.

Thus, it is also possible to provide two or more second slits STb in one BLOCK. A reason that it is possible to provide two or more second slits STb in one BLOCK is that the replacement of the sacrificial layers 47 with the electrode layers 41 is performed from both the first slit STa and the second slit STb as shown in FIG. 8 and FIG. 9. It is possible to perform the replacement of the sacrificial layers 47 with the electrode layers 41 even between the second slits STb by performing the replacement of the sacrificial layers 47 with the electrode layers 41 from the second slits STb as well.

In the second embodiment as well, the second slits STb are provided in the "bowing region B." Therefore, in the second embodiment as well, similarly to the first embodiment, the increase of the resistance of the electrode layer 41 can be suppressed at the location where the inner diameters of the memory holes MH increase due to the "bowing."

Third Embodiment

<Semiconductor Device>

Figure 13:
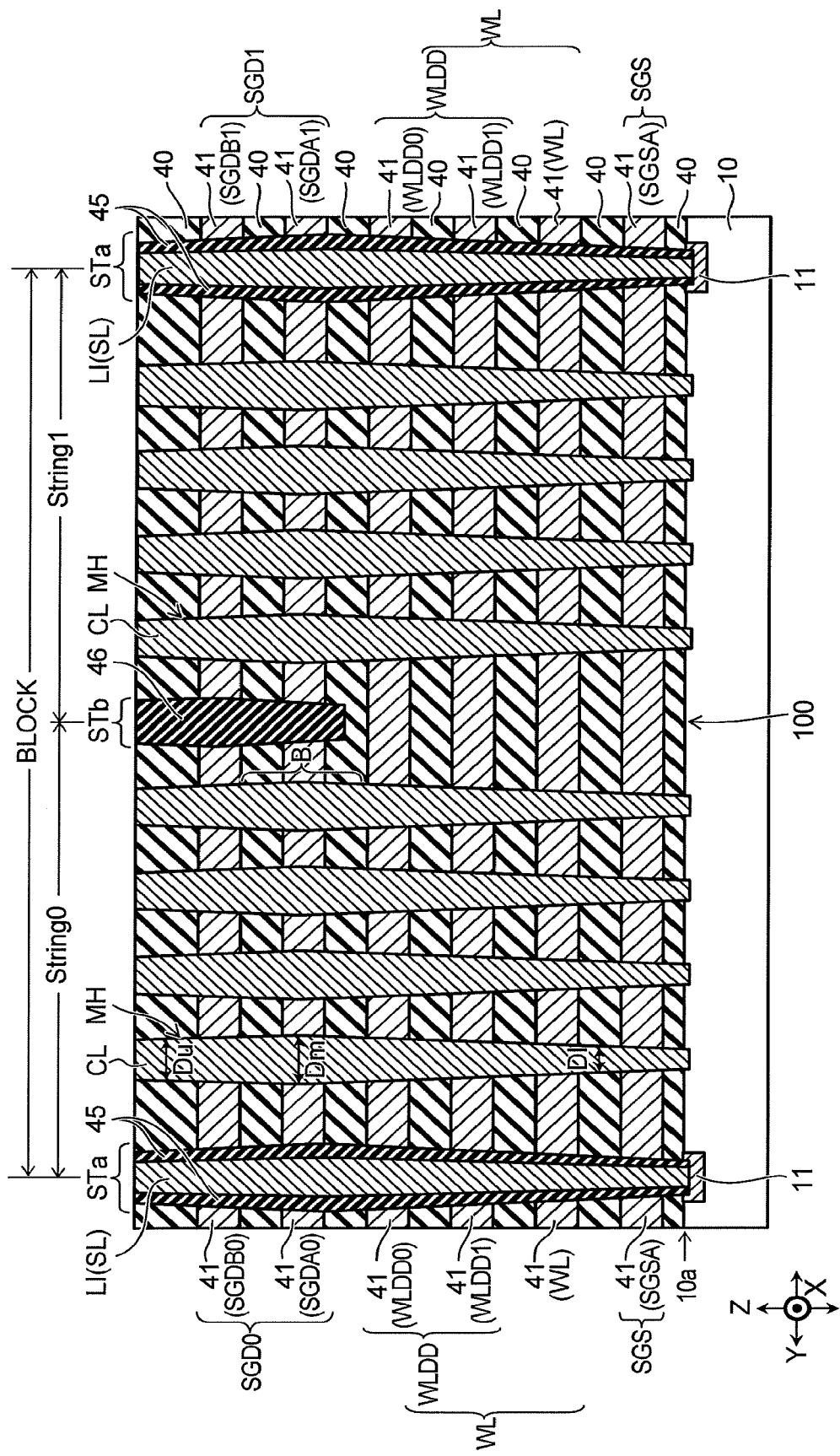
FIG. 13 is a schematic cross-sectional view of a semiconductor device of a third embodiment.

FIG. 13 is a schematic cross-sectional view of a semiconductor device of a third embodiment. The cross section shown in FIG. 13 corresponds to the cross section shown in FIG. 3.

As shown in FIG. 13, for example, the third embodiment differs from the first embodiment shown in FIG. 3 in that the second slit STb is provided in the electrode layers 41 used as the SGDs. In the third embodiment, for example, the second slit STb stops at the insulating body 40 between the electrode layer 41 (SGD1) and the electrode layer 41 (WLDD). The electrode layer 41 (WLDD) is the electrode layer used as a drain-side dummy word line. In the third embodiment, the position where the "bowing" of the memory holes MH is pronounced is at the position where the electrode layers 41 used as the SGDs are provided.

In the third embodiment, the electrode layers 41 used as the SGDs include two electrode layers 41, i.e., the electrode layer 41 (SGDA) and the electrode layer 41 (SGDB). The second slit STb divides the electrode layer 41 (SGDA) and the electrode layer 41 (SGDB) along the X-direction. Therefore, the electrode layer 41 (SGDA) is divided into the electrode layer 41 (SGDA0) on the String0 side and the electrode layer 41 (SGDA1) on the String1 side. Similarly, the electrode layer 41 (SGDB) is divided into the electrode layer 41 (SGDB0) on the String0 side and the electrode layer 41 (SGDB1) on the String1 side.

In the third embodiment, the bottom of the second slit STb stops partway through the stacked body 100 to contact the electrode layers 41 used as the SGDs. Therefore, for example, the third embodiment can be effectively applied in the case where two or more layers of the electrode layers 41 are used as the SGDs, and the maximum inner diameter Dm of the memory holes MH is in the region including the electrode layers 41 used as the SGDs.

In the third embodiment as well, the second slit STb is provided in the "bowing region B;" therefore, similarly to the first embodiment, the increase of the resistance of the electrode layer 41 can be suppressed at the location where the inner diameters of the memory holes MH increase due to the "bowing."

Fourth Embodiment

<Semiconductor Device>

Figure 14:
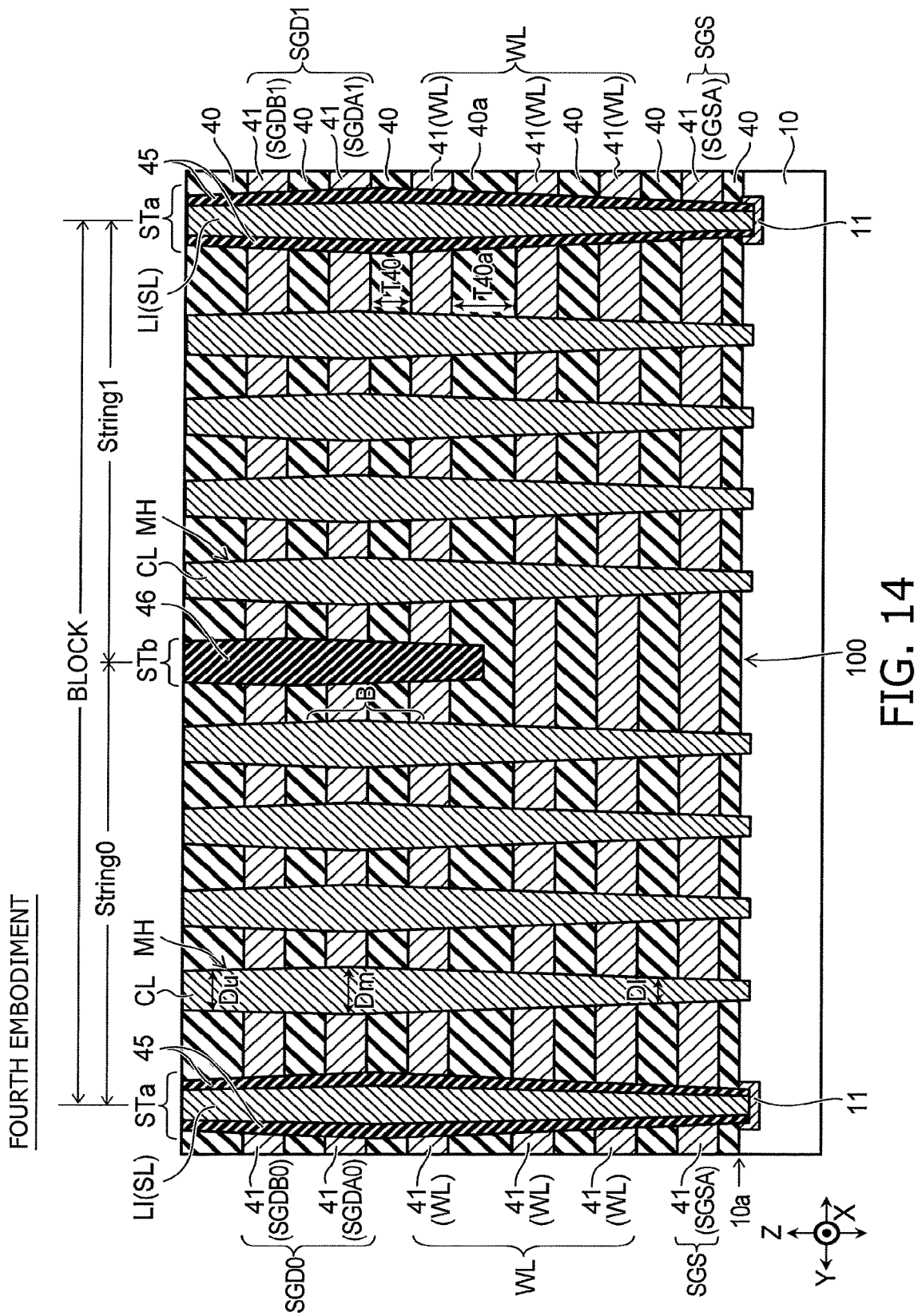
FIG. 14 is a schematic cross-sectional view of a semiconductor device of a fourth embodiment.

FIG. 14 is a schematic cross-sectional view of a semiconductor device of a fourth embodiment. The cross section shown in FIG. 14 corresponds to the cross section shown in FIG. 3.

As shown in FIG. 14, for example, the fourth embodiment differs from the first embodiment shown in FIG. 3 in that a thickness T40a in the Z-direction of an insulating body 40a contacting the bottom of the second slit STb is thicker than a thickness T40 in the Z-direction of the other insulating bodies 40. By setting the thickness T40a to be thicker than the thickness T40 of the other insulating bodies 40, for example, the insulating body 40a performs the role of a stopper when forming the second slit STb. Thereby, the second slit STb can be stopped at the insulating body 40a with higher certainty. Accordingly, according to the fourth embodiment, the controllability of the depth of the second slit STb improves compared to the case where the insulating body 40a is not provided.

According to the fourth embodiment, other than obtaining advantages similar to those of the first embodiment, the controllability of the depth of the second slit STb is improved; therefore, for example, the likelihood can be reduced that the electrode layers 41 used as the WLs may be undesirably divided unintentionally by the second slit STb. As a result, the unintended increase of the resistance of the WLs can be suppressed.

In the fourth embodiment, other than setting the thickness of the insulating body 40a to be thick, it is also possible to use a material that is more difficult to etch than the insulating bodies 40 as the insulating body 40a. For example, in the case where the insulating bodies 40 are silicon oxide, aluminum oxide is used as the insulating body 40a.

Further, the insulating body 40a may include a first insulator, and a second insulator that is different from the first insulator and is stacked with the first insulator. For example, in the case where the first insulator is silicon oxide, for example, it is sufficient to select aluminum oxide as the second insulator.

Fifth Embodiment

<Semiconductor Device>

Figure 15:
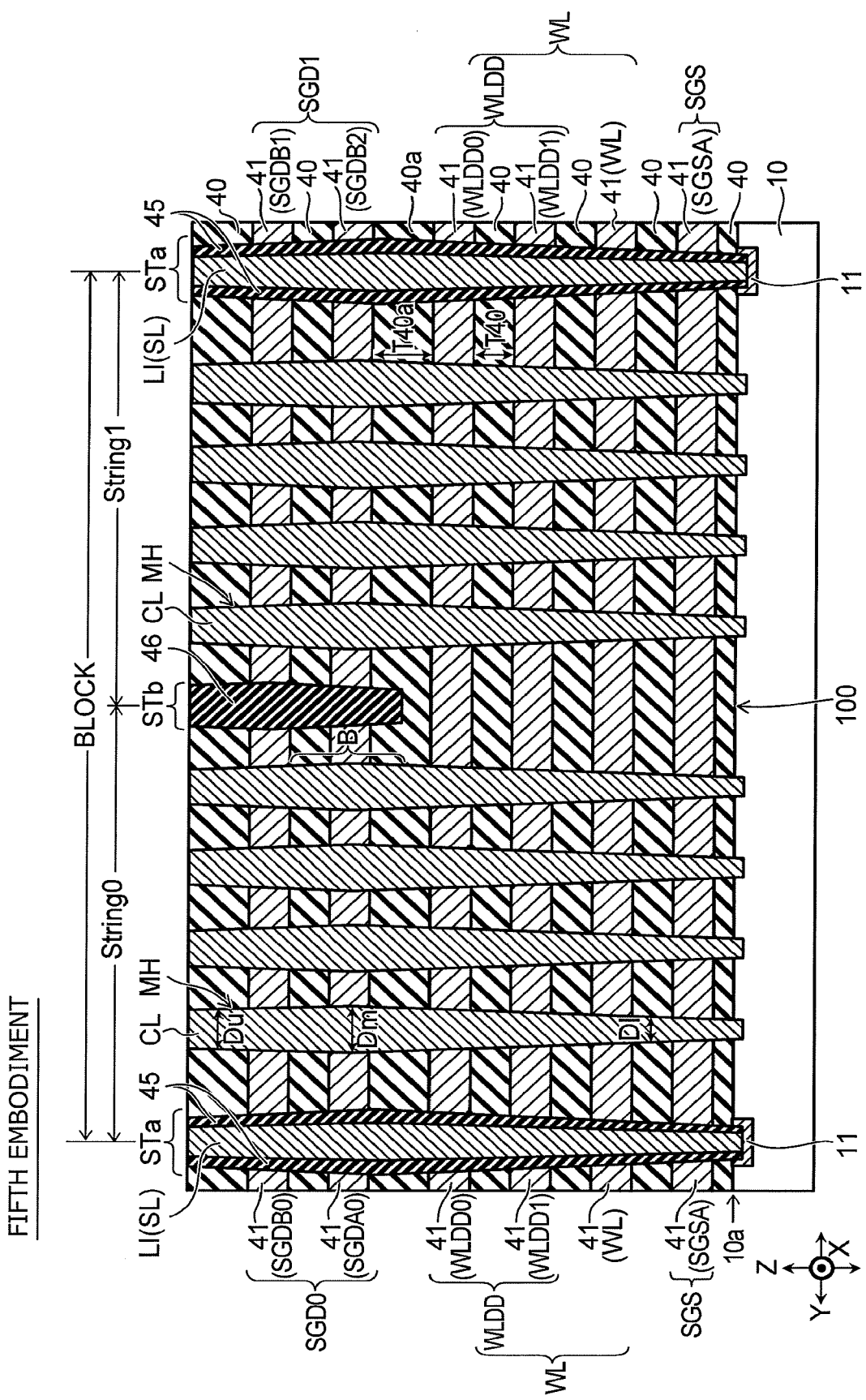
FIG. 15 is a schematic cross-sectional view of a semiconductor device of a fifth embodiment.

FIG. 15 is a schematic cross-sectional view of a semiconductor device of a fifth embodiment. The cross section shown in FIG. 15 corresponds to the cross section shown in FIG. 14.

As shown in FIG. 15, for example, the fifth embodiment differs from the fourth embodiment shown in FIG. 14 in that the insulating body 40a is provided between the electrode layer 41 (SGDA) used as the SGD and the electrode layer 41 (WL) used as the WL. One example of the WL is, for example, a drain-side dummy word line WLDD.

The insulating body 40a that is thick in the Z-direction may be provided between the electrode layer 41 (SGDA) and the electrode layer 41 (WL).

In the fifth embodiment as well, similarly to the fourth embodiment, it is also possible to use a material that is more difficult to etch than the insulating bodies 40 as the insulating body 40a.

Further, similarly to the fourth embodiment, the insulating body 40a may include the first insulator, and the second insulator that is different from the first insulator and is stacked with the first insulator.

Thus, according to the embodiments, a semiconductor device and a method for manufacturing the semiconductor device can be provided in which it is possible to suppress the increase of the resistance of the electrode layers.

While certain the first to fifth embodiments have been described. Embodiments are not limited by the first to fifth embodiments. These embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a stacked body including a plurality of electrode layers stacked with an insulating body interposed along a stacking direction;
at least two first insulating layers extending in a first direction crossing the stacking direction and being provided in the stacked body from an upper end of the stacked body to a lower end of the stacked body;
at least one second insulating layer extending in the first direction and being provided in the stacked body from the upper end of the stacked body to partway through the stacked body between one of the first insulating layers and another one of the first insulating layers; and
a plurality of semiconductor layers extending in the stacking direction and being provided in the stacked body between the second insulating layer and the one of the first insulating layers and between the second insulating layer and the other one of the first insulating layers,
the semiconductor layers having a first width in the first direction at a first position of the stacking direction, a second width in the first direction at a second position of the stacking direction, and a third width in the first direction at a third position of the stacking direction,
the second position being a position between the first position and the third position,
the second width being wider than the first width and the third width, and
the second insulating layer being provided in a region including a location of a maximum width of the semiconductor layers.

2. The device according to claim 1, wherein two or more of the second insulating layers are provided in the stacked body between the one of the first insulating layers and the other one of the first insulating layers.

3. The device according to claim 1, wherein the second insulating layer contacts an electrode layer of the plurality of electrode layers used as a selection gate layer, and the second insulating layer stops in a region including the electrode layer used as the selection gate layer.

4. The device according to claim 1, wherein
a bottom of the second insulating layer reaches one of the insulating bodies, and
a thickness in the stacking direction of the insulating body contacting the bottom of the second insulating layer is thicker than a thickness in the stacking direction of another of the insulating bodies.

5. The device according to claim 4, wherein the insulating body contacting the bottom of the second insulating layer includes a second insulator, and the second insulator is different from a first insulator included in the other of the insulating bodies.

6. The device according to claim 4, wherein the insulating body contacting the bottom of the second insulating layer is disposed between an electrode layer of the plurality of electrode layers used as a selection gate layer and an electrode layer of the plurality of electrode layers used as a dummy word line.

7. The device according to claim 1, wherein a width in a second direction of the second insulating layer is narrower than a width in the second direction of the first insulating layer, the second direction crossing a plane including the first direction and the stacking direction.

8. The device according to claim 1, wherein the semiconductor layers are arranged in a staggered lattice configuration in the stacked body.

9. A method for manufacturing a semiconductor device, comprising:

forming a stacked body including a plurality of sacrificial layers, the plurality of sacrificial layers being stacked with an insulating body interposed along a stacking direction;
forming a plurality of semiconductor layers in the stacked body;
forming at least two first slits in the stacked body from an upper end of the stacked body to a lower end of the stacked body;
forming at least one second slit in the stacked body from the upper end of the stacked body to partway through the stacked body between one of the first slits and another one of the first slits; and
replacing the plurality of sacrificial layers with a plurality of electrode layers via the first slits and the second slit,
the semiconductor layers having a first width in a first direction at a first position of the stacking direction, a second width in the first direction at a second position of the stacking direction, and a third width in the first direction at a third position of the stacking direction, the first direction crossing the stacking direction,
the second position being a position between the first position and the third position,
the second width being wider than the first width and the third width, and
the second slit being formed to cause the second slit to be provided in a region including a location of a maximum width of the semiconductor layers columnar portion.

10. The method according to claim 9, wherein
one of the insulating bodies is formed to have a thickness in the stacking direction thicker than a thickness in the stacking direction of another of the insulating bodies, and
the second slit is formed to cause a bottom of the second slit to stop at the one of the insulating bodies.

* * * * *